United States Patent [19]

Kawai

[11] Patent Number: 4,788,508
[45] Date of Patent: Nov. 29, 1988

[54] POP NOISE SUPPRESSION CIRCUIT FOR AUDIO AMPLIFIER

[75] Inventor: Hiroaki Kawai, Tokyo, Japan

[73] Assignee: Kabushiki Kaisha Toshiba, Kawasaki, Japan

[21] Appl. No.: 162,692

[22] Filed: Mar. 1, 1988

[30] Foreign Application Priority Data

Mar. 6, 1987 [JP] Japan .................. 62-51350

[51] Int. Cl.⁴ ............................. H03F 1/26
[52] U.S. Cl. ...................... 330/51; 330/149
[58] Field of Search ............. 330/51, 149, 252, 297; 455/174, 194, 222, 223

[56] References Cited

U.S. PATENT DOCUMENTS 3,992,677 11/1976 Tsurushima .............. 330/51 X
4,127,743 11/1978 Ozawa et al. .............. 330/51 X
4,371,841 2/1983 Eckert et al. .............. 330/51 X
4,636,739 1/1987 Dijkmans .............. 330/149 X Primary Examiner—Eugene R. Laroche
Assistant Examiner—Steven J. Mottola
Attorney, Agent, or Firm—Finnegan, Henderson, Farabow, Garrett and Dunner

[57] ABSTRACT

In an audio amplifier, a ripple removing filter capacitor is connected to a ripple terminal, and a negative feedback capacitor is connected to a negative feedback terminal. A pop noise suppression circuit of the amplifier has a forcible discharging circuit which is not operated in a steady state of the audio amplifier. The forcible discharging circuit is operated to forcibly discharge residual charges on the ripple removing capacitor and the negative feedback capacitor only when a power supply of the audio amplifier is turned off.

6 Claims, 3 Drawing Sheets

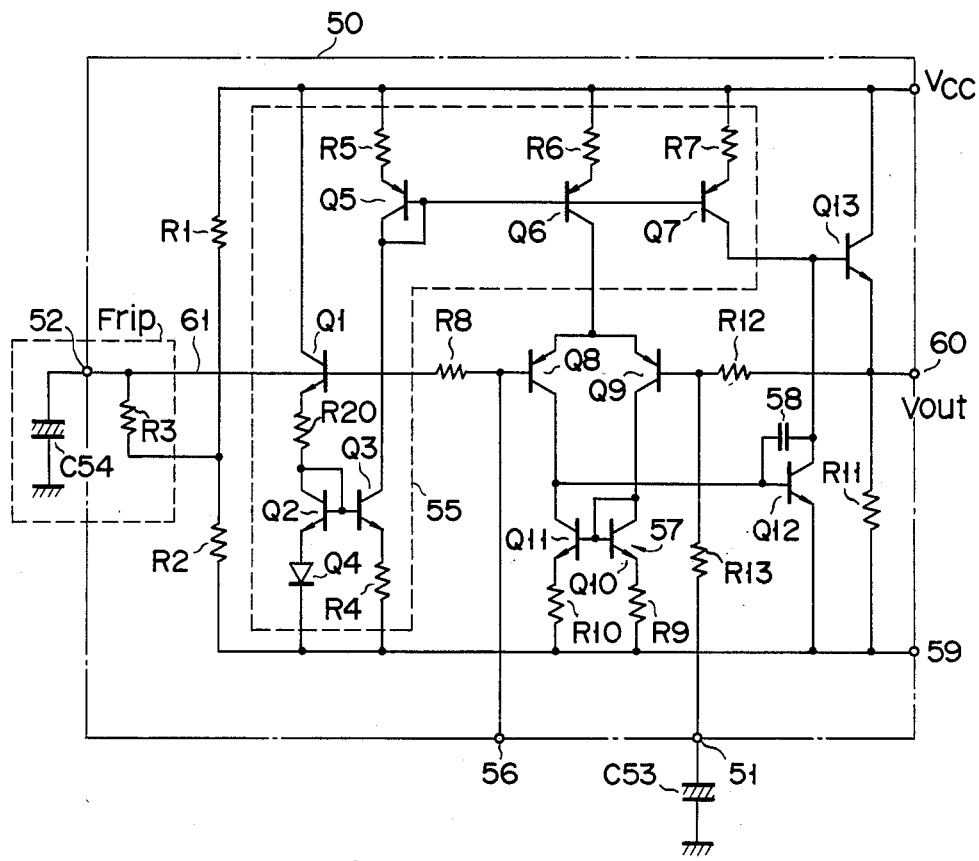
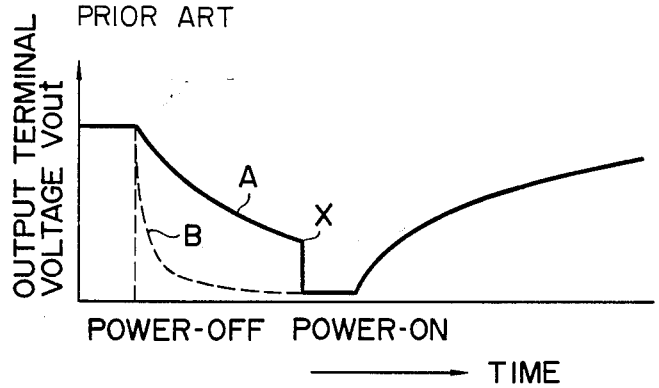
FIG. 2
PRIOR ART
FIG. 3

POP NOISE SUPPRESSION CIRCUIT FOR AUDIO AMPLIFIER

BACKGROUND OF THE INVENTION

1. Field of the Invention

The present invention relates to a pop noise suppression circuit for a semiconductor IC audio amplifier.

2. Description of the Related Art

FIG. 2 shows IC audio amplifier 50, negative feedback capacitor C53, and ripple removing capacitor C54. Capacitors C53 and C54 are externally connected to negative feedback terminal 51 and ripple terminal 52 of amplifier 50, respectively. In this figure, reference symbols R1 and R2 denote bias resistors for voltage-dividing a Vcc power supply voltage, thereby to determine a bias voltage; and R3, a resistor which, together with ripple removing capacitor C54, forms ripple filter "Frip" for removing ripple components of the bias voltage. Reference numeral 55 denotes a current source circuit which receives the output voltage from ripple filter "Frip" and supplies a current corresponding to the input voltage. Circuit 55 comprises bipolar transistors Q1 to Q7, and resistors R4 to R7, and R20. Reference symbols Q8 and Q9 denote transistors for a differential amplifier. The emitters of transistors Q8 and Q9 are commonly connected, and are also connected to the base of current source transistor Q6. Reference numeral 56 denotes an input terminal connected to the base of transistor Q8. The base of transistor Q8 is connected to the output terminal of ripple filter "Frip" via resistor R8. Reference numeral 57 denotes a load circuit formed of the differential transistor pair. Circuit 57 comprises current-mirror-connected transistors Q10 and Q11, and resistors R9 and R10. Reference symbol Q12 denotes an emitter-grounded transistor which receives the output from transistor Q8. Capacitor 58 is connected between the collector and base of transistor Q12. The collector of transistor Q12 is connected to current source transistor Q7. Reference symbol Q13 denotes an emitter-follower transistor which receives the collector output from emitter-grounded transistor Q12. The emitter of transistor Q13 is connected to ground terminal 59 via resistor R11, and is connected directly to output terminal 60. Negative feedback resistor R12 is connected between output terminal 60 and the base of transistor Q9, and resistor R13 is connected between the base of transistor Q9 and negative feedback capacitor C53.

Ripple filter "Frip" prevents the ripple components of the Vcc power supply from leaking to bias output terminal 52, via bias resistor R1, and the filter time constant thereof serves to reduce variations in the voltage passing along output line (ripple line) 61 of ripple filter "Frip" upon ON/OFF operation of the power supply voltage, thus suppressing generation of pop noise signals.

When the output voltage from output terminal 60 rapidly changes upon ON/OFF of the power supply, a current suddenly flows through a loudspeaker (not shown) connected to output terminal 60, this causes pop noise to be generated. Since pop noise can cause serious physical discomfort, it must therefore be suppressed. In order to do this, abrupt variations in the output voltage of output terminal 60 must be suppressed. In a conventional amplifier, such suppression is realized, using a time constant of ripple filter "Frip", such that a voltage on ripple line 61 is slowly varied upon ON/OFF of the power supply.

With this method, if the ON/OFF operation of the power supply is performed with a certain time interval, the pop noise suppression effect by ripple filter "Frip" can be obtained. However, when the ON/OFF operation is continuously and quickly repeated, in particular, when the ON operation is performed immediately after the OFF operation, pop noise is generated.

More specifically, since ripple removing capacitor C54 and negative feedback capacitor C53 have large capacitances, charges remain in the capacitors for some time after the power supply has been turned off. Curve A in FIG. 3 represents how output voltage Vout at output terminal 60 changes with respect to time. When power supply Vcc is turned off, output voltage Vout decreases gradually, due to the residual charge remaining in negative feedback capacitor C53. As a result, the voltage on ripple line 61 is decreased slowly with a rate corresponding to the ripple filter time constant. When the power supply is turned on before the capacitors are substantially discharged, current source circuit 55 is turned on by the voltage on ripple line 61, and transistors Q8 and Q9, transistor Q12, and the emitter follower circuit immediately become active. However, if transistors Q8 and Q9 become active before output voltage Vout of output terminal 60 is sufficiently lowered, since the voltage at input terminal 56 is immediately decreased upon the power supply being turned off, the base biases of transistors Q8 and Q9 become unbalanced. As a result, output voltage Vout of output terminal 60 drops abruptly to the ground level (point X in FIG. 3). This sudden change in the output voltage causes the loudspeaker connected to output terminal 60 to generate pop noise.

SUMMARY OF THE INVENTION

The present invention has been conceived in order to solve the above-described problem wherein when ON/OFF of the power supply is continuously and quickly repeated—in particular, when the ON operation is performed immediately after the OFF operation—, the residual charges remaining in the external large-capacitance capacitors induce immediate variations in output voltage of the output terminal, causing pop noise to be generated, and has as its object to provide a pop noise suppression circuit for an audio amplifier, which can suppress the generation of pop noise when the ON/OFF operation of the power supply is repeated.

In an audio amplifier wherein a ripple removing filter is connected to a ripple terminal, and a negative feedback capacitor is connected to a negative feedback terminal, the pop noise suppression circuit of the present invention comprises a forcible discharging circuit which is not operated in a steady state of the audio amplifier but is operated only when a power supply is turned off, so that residual charges on the ripple removing filter capacitor and the negative feedback capacitor are forcibly discharged.

Upon operation of the forcible discharging circuit, a residual time of charges on the ripple removing capacitor and the negative feedback capacitor upon OFF of the power supply can be shortened. Therefore, when the ON/OFF operation of the power supply is continuously and quickly repeated, in particular, when the ON operation is performed immediately after the OFF operation, an abrupt change in output voltage of the output terminal does not occur. Therefore, no pop noise is generated from a loudspeaker connected to the output terminal.

BRIEF DESCRIPTION OF THE DRAWINGS

FIG. 2 is a circuit diagram showing a pop noise suppression circuit for an audio amplifier, in which a pop noise suppression effect is insufficient;

FIG. 3 is a graph showing a change in output voltage when the ON/OFF operation of a power supply is performed in the audio amplifier shown in FIG. 2.

DESCRIPTION OF THE PREFERRED EMBODIMENTS

An embodiment of the present invention will be described with reference to the accompanying drawings.

Figure 1:
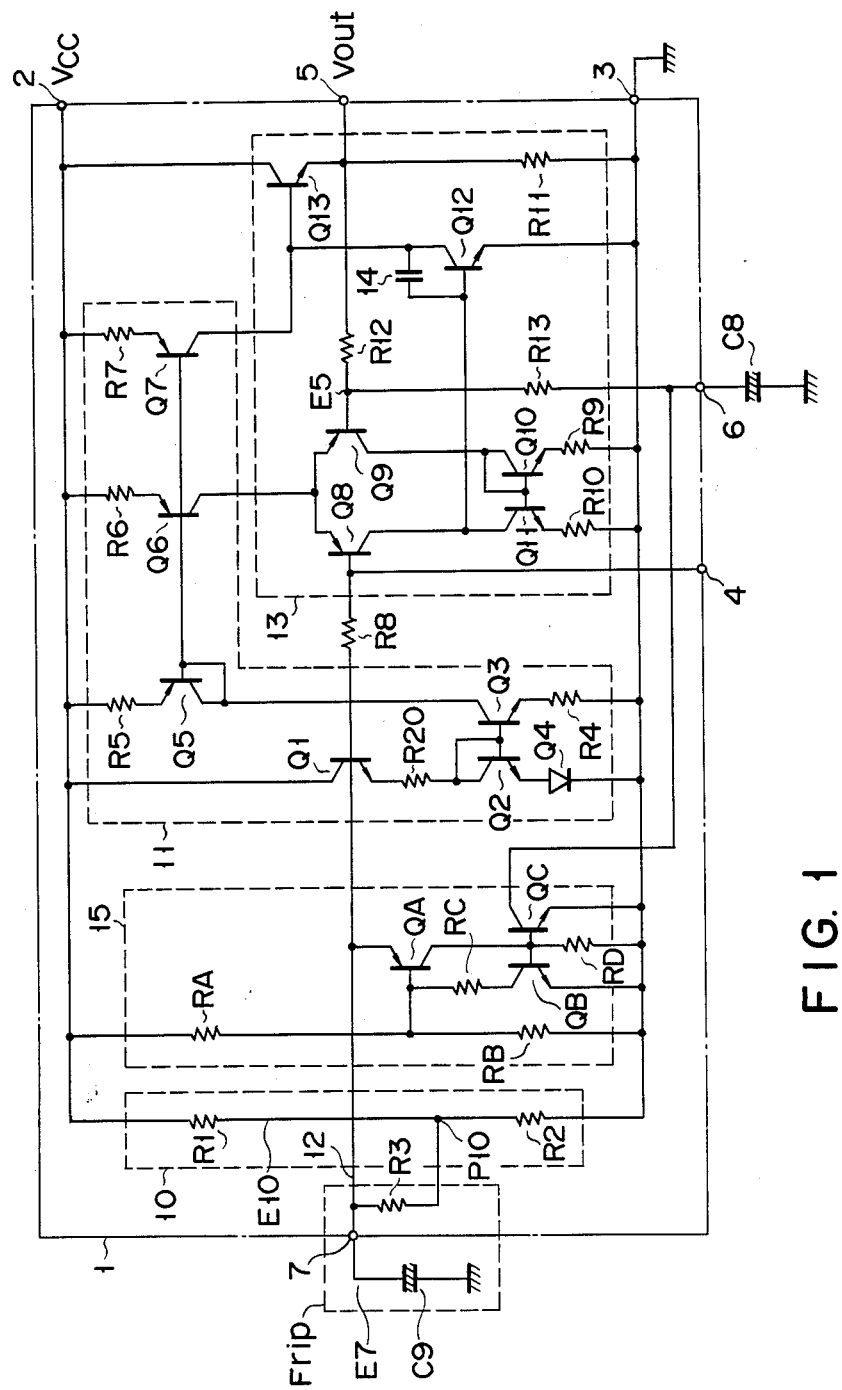
FIG. 1 is a circuit diagram showing a pop noise suppression circuit for an audio amplifier according to an embodiment of the present invention.

In FIG. 1, reference numeral 1 denotes an IC audio amplifier; 2, a Vcc power supply terminal; 3, a ground terminal; 4, an input terminal; 5, an output terminal; 6, a negative feedback terminal; and 7, a ripple terminal. Negative feedback capacitor C8 is externally connected between negative feedback terminal 6 and a ground potential terminal. Ripple removing capacitor C9 is connected between ripple terminal 7 and the ground potential terminal.

In audio amplifier 1, reference numeral 10 denotes a bias circuit in which resistors R1 and R2 are connected in series with each other between the power supply node and the ground node, and which provides bias voltage E10 including ripple components. Reference numeral R3 denotes a resistor connected between output terminal P10 (node between resistors R1 and R2) of bias circuit 10 and ripple terminal 7. Resistor R7 and ripple removing capacitor C9 constitute ripple filter "Frip". Reference numeral 11 denotes a current source circuit which receives bias voltage E7 supplied from the output terminal of ripple filter "Frip" through ripple line 12 and supplies an operating current to amplifier circuit section 13.

Current source circuit 11 comprises: a series circuit inserted between the Vcc and ground nodes and consisting of first npn transistor Q1, resistor R20, second npn transistor Q2 whose collector and base are connected to each other, and diode-connected transistor Q4; third npn transistor Q3, the base of which is connected to the base of second transistor Q2; resistor R4 connected between the emitter of third transistor Q3 and the ground node; a series circuit inserted between the Vcc node and the collector of third transistor Q3 and consisting of resistor R5 and fifth pnp transistor Q5 whose collector and base are connected to each other; sixth and seventh pnp transistors Q6 and Q7, the bases of which are connected to the base of fifth transistor Q5; and resistors R6 and R7 which are connected between the Vcc node and the emitters of sixth and seventh transistors Q6 and Q7, respectively.

Amplifier circuit section 13 comprises a differential amplifier, an emitter-grounded circuit, and an emitter follower. The differential amplifier comprises eighth and ninth pnp transistors Q8 and Q9 which serve as a differential pair, and the emitters of which are commonly connected and are also connected to the collector of sixth transistor Q6 for the current source, and a current-mirror load circuit connected between the collectors of transistors Q8 and Q9 and the ground node.

The load circuit has 10th npn transistor Q10 and resistor R9 connected between the collector of ninth transistor Q9 and the ground node, and 11th npn transistor Q11 and resistor R10 connected in series with each other between the collector of eighth transistor Q8 and the ground node. The collector and base of 10th transistor Q10 are connected to each other, and the bases of transistors Q10 and Q11 are connected.

The emitter-grounded circuit consists of 12th npn transistor Q12, the base of which is connected to the collector of 8th transistor Q8, the emitter of which is grounded, and the collector of which is connected to the collector of 7th transistor Q7, and capacitor 14 connected between the collector and base of transistor Q12.

The emitter follower consists of 13th npn transistor Q13, the base of which is connected to the collector of 12th transistor Q12 and the collector of which is connected to the Vcc node, and resistor R11 connected between the emitter of transistor Q13 and the ground node. The emitter of transistor Q13 is connected to output terminal 5.

The base of eighth transistor Q8 is connected to input terminal 4, and is also connected to ripple terminal 7 through resistor R8. The base of ninth transistor Q9 is connected to output terminal 5 through negative feedback resistor R12, and is also connected to negative feedback terminal 6 through resistor R13.

Furthermore, according to the present invention, forcible discharging circuit 15 is added to audio amplifier 1. Forcible discharging circuit 15 comprises a series circuit of resistors RA and RB, which is connected between the Vcc and ground nodes; pnp transistor QA, the base of which is connected to the node between resistors RA and RB and the emitter of which is connected to ripple line 12; a series circuit consisting of resistor RC and npn transistor QB, the base of which is connected to the collector of transistor QA, and which is connected between the base of transistor QA and the ground node; resistor RD connected between the base of transistor QB and the ground node; and npn transistor QC, the base of which is connected to the base of transistor QB, the emitter of which is grounded, and the collector of which is connected to negative feedback terminal 6.

The operation of audio amplifier 1 and forcible discharging circuit 15 will be described. In a steady state, the output from bias circuit 10 is applied to current source circuit 11 through ripple filter "Frip". Upon operation of current source circuit 11, amplifier circuit section 13 is operated, and an audio signal input from input terminal 4 is amplified and is output to output terminal 5. In this case, the base bias voltage of ninth transistor Q9 is stabilized by the negative feedback effect of negative feedback resistor R12 and negative feedback capacitor C8. In this case, forcible discharging circuit 15 is inoperative. More specifically, base voltage VB(QA) of transistor QA is determined by the resistance ratio of resistors RA and RB and is represented by:

$$VB(QA) = \frac{RB}{RA + RB} Vcc \qquad (1)$$

In the steady state, voltage Vrip on ripple line 12 is represented by:

$$Vrip = \frac{R2}{R1 + R2} Vcc \qquad (2)$$

When the resistances of resistors RA and RB are determined to yield:

$$VB(QA) > Vrip \qquad (3)$$

transistor QA is turned off, and transistors QB and QC are kept off since no base current is supplied thereto.

When the power supply is turned off in this state, the Vcc voltage is immediately decreased to the ground level, and hence, voltage VB(QA) is also decreased to the ground level. However, voltage Vrip on ripple line 12 is slowly decreased with a rate corresponding to the time constant of ripple filter "Frip". During a decrease in voltage Vrip, when base-emitter voltage VBE(QA)=Vrip−VB(QA) of transistor QA becomes larger than about 0.6 to 0.7V, transistor QA is turned on, and hence, transistors QB and QC are simultaneously turned on. When transistor QC is turned on, its collector current forcibly absorbs (discharges) the residual charge in negative feedback capacitor C8. Since the emitter of transistor QA is connected to ripple line 12, when transistor QA is turned on, its emitter current forcibly absorbs (discharges) the residual charge in ripple removing capacitor C9.

In this case, a kind of thyristor structure is formed by transistors QA and QB and resistor RC, and this thyristor has a function of holding the ON state of transistor QA once transistor QA is turned on. More specifically, when transistor QA is turned on, transistor QB is also turned on, and positive feedback occurs such that the base current of transistor QA is increased and the collector current thereof is also increased. These transistors are kept operated until the residual charges on capacitors C9 and C8 are satisfactorily discharged. A change in output voltage Vout obtained by the above operation is represented by broken curve B in FIG. 3.

Therefore, since above-mentioned forcible discharging circuit 15 is added, even when the power supply is turned on/off repeatedly, the amplifier can be free of the influence of the residual charges, and no abrupt change in output voltage Vout occurs, thus suppressing pop noise.

Note that resistor RC in forcible discharging circuit 15 has a function of adjusting a discharge rate when transistors QA and QB are turned on to discharge the charges on capacitor C9. When the resistance of resistor RC can be appropriately selected, the discharge rate of capacitor C9 is set to be smaller than that of capacitor C8, so that during forcible discharging of capacitors C8 and C9 by circuit 15, the base potential of transistor Q9 is always lower than that of transistor Q8. Then, output voltage Vout during forcible discharging is simply decreased, and pop noise can be satisfactorily suppressed.

Figure 4:
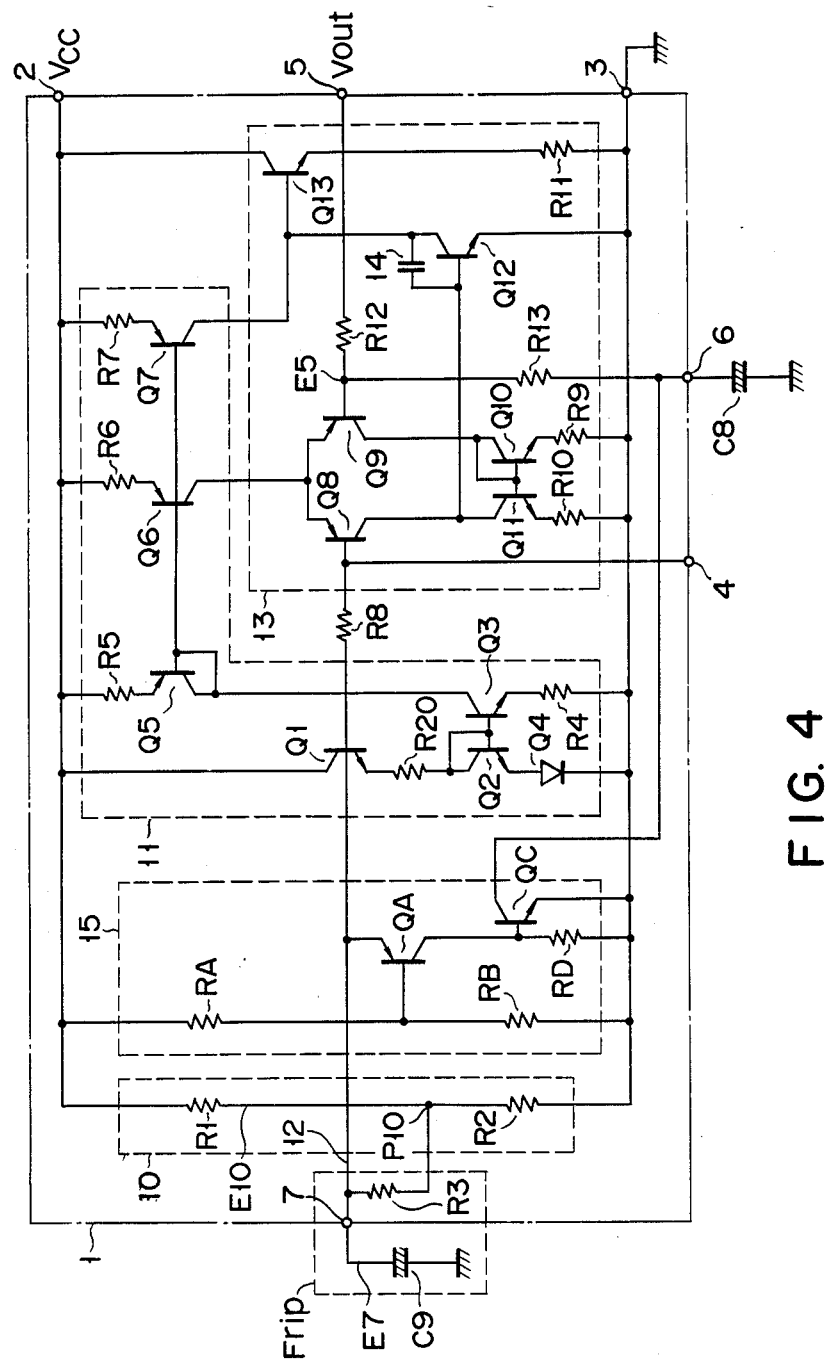
FIG. 4 is a circuit diagram of a pop noise suppression circuit according to another embodiment of the present invention.

FIG. 4 shows another embodiment of the present invention. In FIG. 1, the forcible discharging operation is reliably performed by utilizing the self holding effect of thyristor-connected transistors QA and QB as forcible discharging circuit 15. However, in FIG. 4, transistor QB is omitted from the arrangement of FIG. 1.

Without transistor QB, once transistor QA is turned on upon OFF of power supply Vcc, capacitor C9 is forcibly discharged through the emitter-collector path of transistor QA and the base-emitter path of transistor QC, and capacitor C8 is forcibly discharged through the collector-emitter path of transistor QC. Therefore, with the circuit arrangement of FIG. 4, voltage characteristics indicated by curve B in FIG. 3 can be obtained, and generation of pop noise can be suppressed.

The arrangement of FIG. 4 is slightly inferior to that of FIG. 1 in view of the reliability of the forcible discharging operation, but is simpler than that of FIG. 1.

According to a pop noise suppression circuit for an audio amplifier according to the present invention, a forcible discharging circuit is arranged to forcibly discharge residual charges on a ripple removing capacitor and a negative feedback capacitor. Therefore, even when the ON/OFF operation of a power supply is continuously and quickly repeated—in particular, even when the OFF operation of the power supply is performed immediately after the ON operation—, no abrupt change in output voltage of the output terminal occurs, and generation of pop noise from a loudspeaker can be suppressed.

What is claimed is:

1. A pop noise suppression circuit for an audio amplifier having a non-inverting input, an inverting input, and an output terminal, comprising:

bias means, inserted between first and second power supply circuits of said audio amplifier, for providing, from a bias potential supply terminal, a bias potential, corresponding to a potential difference between said first and second power supply circuits;

ripple filter means, inserted between the non-inverting input of said audio amplifier and the bias potential supply terminal of said bias means, for reducing ripple components in the bias potential, said ripple filter means including a first capacitor which is charged by the bias potential, a charging voltage of said first capacitor being supplied to the non-inverting input of said audio amplifier;

negative feedback means, inserted between the inverting input and the output terminal of said audio amplifier, for negatively feeding an output signal of said audio amplifier back to the inverting input, said negative feedback means including a second capacitor which is charged by a potential at the output terminal, a charging voltage of said second capacitor being supplied to the inverting input of said audio amplifier; and forcible discharging means, coupled to said first and second capacitors and said first and second power supply circuits, for forcibly discharging a charge accumulated in said first and second capacitors when a voltage corresponding to the potential difference between said first and second power supply circuits is changed from a value greater than the charging voltage of said first capacitor to a value less than the charging voltage.

2. A circuit according to claim 1, wherein said forcible discharging means includes a self-holding switch circuit which, when discharging of said first capacitor is started, is turned on to keep discharging said first capacitor until discharging of said first capacitor is substantially completed.

3. A circuit according to claim 2, wherein said forcible discharging means includes means for decreasing a discharge rate for said first capacitor to be lower than that for said second capacitor.

4. A circuit according to claim 1, wherein said forcible discharging means includes a switch circuit in which a discharge rate for said first capacitor is lower than that for said second capacitor.

5. A pop noise suppression circuit for an audio amplifier having a bias circuit, a ripple filter connected to said bias circuit and including a first capacitor, and a differential amplifier circuit which receives an output voltage from said ripple filter, as one input bias, and a bias from an output terminal, via a negative feedback circuit including a second capacitor, as another input bias, said pop noise suppression circuit further comprising a forcible discharging circuit which is not operated in a steady state of said audio amplifier, and which forcibly discharges residual charges in said first and second capacitors only when a power supply of said audio amplifier is turned off.

6. A circuit according to claim 5, wherein said forcible discharging circuit has a first transistor of a first conductivity type, which is turned on by utilizing a delay in a decrease in output voltage from said ripple filter with respect to a decrease in voltage of said power supply, and a second transistor of a second conductivity type, which is turned on by a collector current of said first transistor, the charge in said first capacitor being absorbed by an emitter current of said first transistor, and the charge in said second capacitor being absorbed by a collector current of said second transistor.

* * * * *